United States Patent [19]

Bernier

[11] Patent Number: 5,146,305
[45] Date of Patent: Sep. 8, 1992

[54] ASYMMETRIC GATE TURN OFF THYRISTOR WITH ANODE SHORT-CIRCUITS AND REDUCED TURN ON CURRENT

[75] Inventor: Eric Bernier, Tours, France

[73] Assignee: SGS-Thomson Microelectronics, S.A., Gentilly, France

[21] Appl. No.: 421,597

[22] Filed: Oct. 13, 1989

[30] Foreign Application Priority Data

Oct. 14, 1988 [FR] France .................. 88 13573

[51] Int. Cl.[5] .................. H01L 29/74; H01L 29/747
[52] U.S. Cl. .......................................... 357/38; 357/39
[58] Field of Search ............... 357/38, 38 A, 38 C, 357/38 E, 38 G, 38 L, 38 LA, 38 P, 38 T, 39

[56] References Cited

FOREIGN PATENT DOCUMENTS

| 0022355 | 1/1981 | European Pat. Off. ............. 357/38 |
| 0200863 | 2/1986 | European Pat. Off. . |
| 0022430 | 6/1972 | Japan .................................. 357/38 |
| 0048808 | 8/1988 | Japan .................................. 357/38 |

*Primary Examiner*—Rolf Hille
*Assistant Examiner*—Wael Falmy
*Attorney, Agent, or Firm*—Browdy and Neimark

[57] ABSTRACT

Thyristors conventionally comprise an N type cathode layer divided into oblong domains with two principal axes intersecting at a center and surmounted by a metallization layer, a P type gate layer which has a metalization layer surrounding the cathode domains, an N type base layer comprising a lightly doped first sublayer and a heavily doped second sublayer and a P type anode layer with a metallization layer. Anode short-circuit areas are formed by extremities of the second sublayer extending through the anode layer to the metalization layer. In accordance with the invention the short-circuit areas, rather than being circular and aligned with the centers of the cathode domains, are elongate strips disposed in marginal areas of unit cells defined by the cathode domains, symmetrically relative to the centers of the cells. These areas may be strips parallel to the major axis or concentric annuli which intersect the major axes of the cells disposed in rings towards the ends thereof. The thyristor turn on current can be reduced by a factor of 4 without otherwise affecting performance.

5 Claims, 2 Drawing Sheets

ASYMMETRIC GATE TURN OFF THYRISTOR WITH ANODE SHORT-CIRCUITS AND REDUCED TURN ON CURRENT

BACKGROUND OF THE INVENTION

1. Field of the invention

The invention concerns a gate turn off thyristor which comprises a pellet of semiconductor material incorporating an N type cathode layer divided into separate oblong domains with major and minor principal axes intersecting at a center and defining respective unit cells, a P type gate layer which has a free surface between the cathode domains, a base layer comprising a lightly doped N type first sublayer forming a junction with the gate layer and a heavily doped N type second sublayer forming a junction with a P type anode layer, and respective metal contact layers deposited on the free surfaces of the cathode domains, of the gate layer round the cathode domains and of the anode layer, the heavily doped N type second sublayer passing in a localized way through the anode layer to form anode short-circuit areas in contact with the anode metal layer.

2. Description of the prior art

Thyristors commonly use an NPNP structure; they block a forward voltage if the current injected via the gate is below a threshold. When the gate current exceeds this threshold the thyristor conducts and continues to conduct even if the gate current is interrupted.

Gate turn off (GTO) thyristors (see for example documents FR-A-2565409, FR-A-2610402) can be returned to the blocking (or off) state by draining charge through the gate. This blocking capability is obtained in structures in which the junction boundaries between the N type cathode layer and the P type gate layer are very large in relation to the surfaces of the junctions, to favor draining of charge by the gate below the cathode layer. An arrangement that is frequently used has the cathode layer disposed in oblong islets or domains the major axis of which is much longer than the minor axis.

In many applications there is no need for the thyristor to be able to withstand reverse voltages of comparable magnitude to the forward voltages for which it is designed; a diode is frequently connected in parallel with the thyristor to conduct in the opposite direction in order to damp out additional blocking current in inductive loads. "Asymmetric" thyristors (so called because of the asymmetry of their breakdown voltages in the forward and reverse directions) have been developed (see, for example, document FR-A-2514558). In practice the asymmetry is obtained by dividing the N type base layer into a lightly doped first sublayer and a heavily doped second sublayer; this arrangement substantially doubles the breakdown field in the forward direction with the result that the thickness of the base layer can be significantly reduced; losses essentially occur in the lightly doped N type sublayer. In particular, the asymmetric structure reduces switching losses when the device is turned off.

Both symmetric and asymmetric thyristors have been provided with anode short-circuits in the form of areas in which the N type base layer (or the heavily doped N type second sublayer in the case of asymmetric thyristors) extends through the anode layer to the anode metalization.

The effect of these anode short-circuits is to increase the speed at which electrical charge is evacuated during the blocking phase, especially at the end of this phase, and consequently to reduce the turn off losses.

On the other hand, thyristors with anode short-circuits feature an increased turn on current and therefore increased turn on losses and control power losses.

Conventionally the anode short-circuit areas are circular in shape and are disposed facing the center of the cells (defined by the cathode domains).

An object of the invention is to create an asymmetric thyristor with anode short-circuits featuring a reduced turn on current and balanced turn off function through avoiding concentration of current in certain cells during the turn off phase.

SUMMARY OF THE INVENTION

The invention consists in a gate turn off thyristor which comprises a pellet of semiconductor material incorporating an N type cathode layer divided into separate oblong domains with major and minor principal axes intersecting at a center and defining respective unit cells, a P type gate layer which has a free surface between the cathode domains, a base layer comprising a lightly doped N type first sublayer forming a junction with the gate layer and a heavily doped N type second sublayer forming a junction with a P type anode layer, and respective metal contact layers deposited on the free surfaces of the cathode domains, of the gate layer round the cathode domains and of the anode layer, the heavily doped N type second sublayer passing in a localized way through the anode layer to form anode short-circuit areas in contact with the anode metal layer, in which thyristor said anode short-circuit areas are in the form of elongate strips disposed in marginal areas of said cells and symmetrical relative to the centers of said cells.

With the proposed structure the turn on current is improved by a factor of 4. It may be assumed that this is due to the fact that in the conventional structure the striking field and the charge extraction field through the anode short-circuits are aligned but in the inventive structure the striking field is perpendicular to the planes of the layers while the extraction field is parallel to them.

What is more, the extent of the anode short-circuit strips makes it possible to compensate for localized defects of contact with the anode metalization and the symmetry of their arrangement relative to the center of the cell balances the charge extraction field distribution.

The anode short-circuit areas of each cell are preferably strips tangential to a circle concentric with the cell at two diametrally opposed points on one principal axis. This arrangement ensures geometrical symmetry of the extraction field relative to the two principal axes of each cell.

The strips are preferably parallel to the cell major axis. There is virtually no field gradient on this major axis.

Alternatively, the cells may be arranged in successive rings with a common center and their major axes parallel and the anode short-circuit areas may then be in the form of two annuli per ring intersecting the major axis of each cell near its ends. With this arrangement, in which the curvature of the annuli where they cross the cells is in fact negligible, the extraction field is for the most part directed along the major axis.

In this embodiment the annuli are advantageously interrupted by gaps centered on the major axes of the cells. This not only increases the distances between the anode short-circuit areas and the centers of the cell conductor channels but also avoids total separation of the various anode layer areas between the annuli.

Secondary characteristics and further advantages of the invention will emerge from the following description given by way of example only with reference to the appended diagrammatic drawings.

DESCRIPTION OF THE PREFERRED EMBODIMENTS

Figure 1:
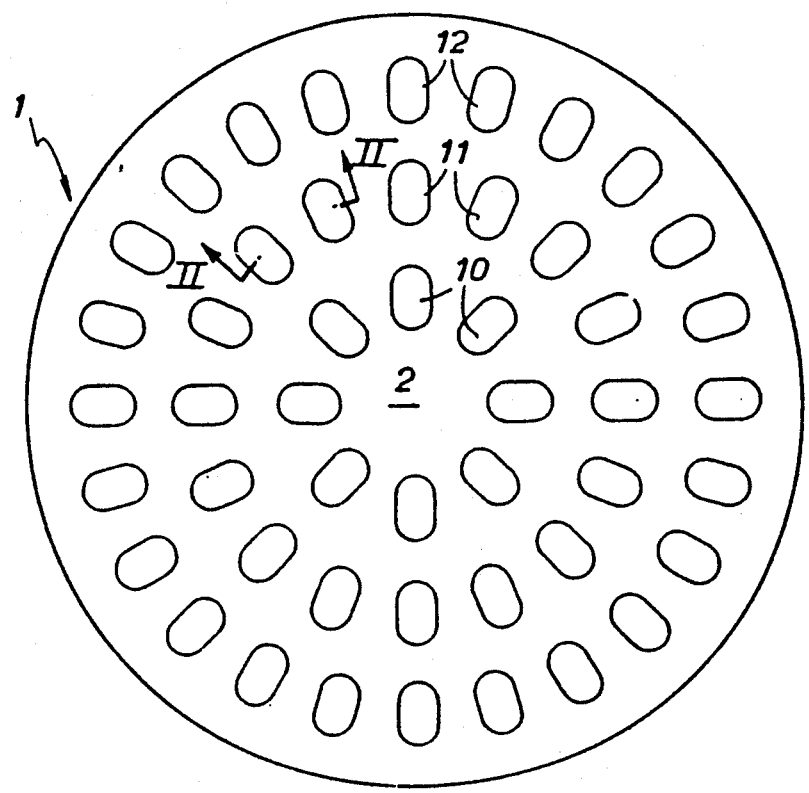
FIG. 1 shows a thyristor in accordance with the invention seen on the cathode side.
Figure 2:
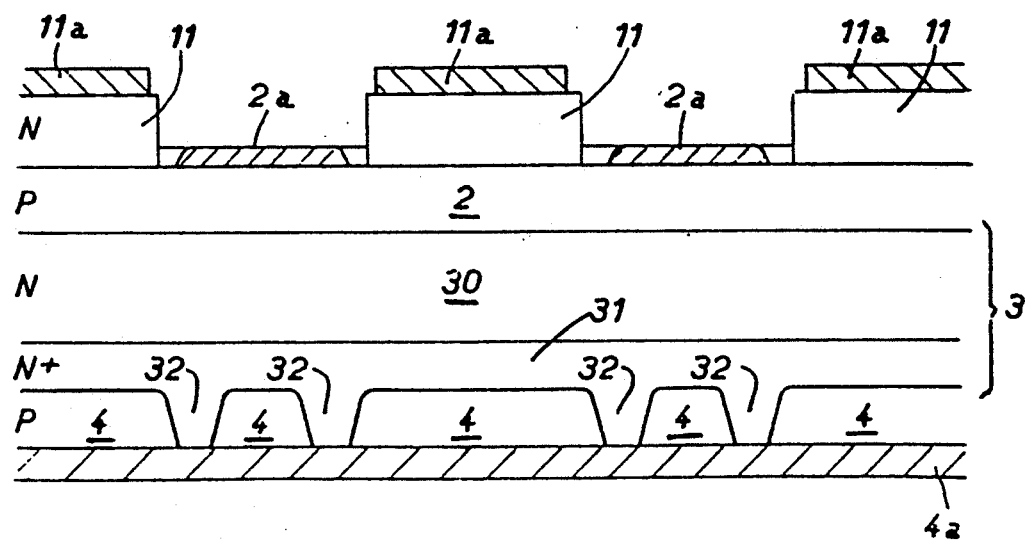
FIG. 2 is a cross-section on the circumferential arc II—II in FIG. 1.

In the embodiment shown in FIGS. 1 and 2 the thyristor conventionally comprises, in a circular semiconductor pellet 1, an N type cathode layer divided into oblong domains arranged in three rings 10, 11 and 12 and each having two principal axes, a radial major axis and a minor axis tangential to the respective circumference. A metalization layer 11a on the cathode layer enables the necessary connections. The N type cathode layer rests on a P type gate layer which has a free surface between the cathode domains or islets 10, 11 and 12 and onto which is deposited a metalization layer 2a for gate connection. Below the gate layer 2 is an N type base layer 3 comprising a lightly doped N type first sublayer 30 which forms a junction with the gate layer 2; this sublayer is relatively thick, its thickness and its doping rate essentially determining the resistance to forward voltage. The sublayer 30 is extended by a heavily doped second sublayer 31 which forms a junction with a P type anode layer 4 the free surface of which carries a metalization layer 4a for the anode connection.

As shown in FIG. 2, extensions 32 of the second sublayer 31 pass in a localized way through the anode layer 4, ending flush with the layer 4 in contact with the metalization 4a to form anode short-circuits.

The division of the cathode layer into separate domains defines gate turn off thyristor unit cells functioning in parallel.

It will be noted that everything described so far is conventional: the NPNP four-layer structure of the thyristor, the arrangement of the cathode on the gate in oblong islets enabling gate turn off control, lateral draining of charge, the action of the gate remaining effective in practise up to the major axis, the sub-division of the base layer into a lightly doped sublayer and a heavily doped sublayer giving the thyristor an asymmetric breakdown resistance (high in the forward direction, low in the reverse direction), and the provision of anode short-circuits to reduce turn off losses by increasing the rate of flow of charge in the turn off phase.

The novelty of the invention lies in the topography of the anode short-circuits, as will now be described and commented on with reference to FIGS. 3 through 5.

It will be understood that the conventional aspects of anode short-circuit asymmetric GTO thyristors extend to the doping rates and choice of dopants for implementing the various layers and sublayers and the thyristor manufacturing process in which the layers are grown on either side of the base layer 3.

It will be remembered that in the conventional arrangement the anode short-circuits are circular extensions centered on a line through the center of the cathode domains and therefore of the unit cells, at the intersection of the principal axes, that is to say on the main discharge axis.

This arrangement brings the charge collector as close as possible to the area in which the charge density is maximum and is efficient for collecting charges during the turn off phase. On the other hand, it contributes to increasing the gate current needed to start the discharge. The reduction of turn off losses is counterbalanced by an increase in turn on losses.

Figure 3:
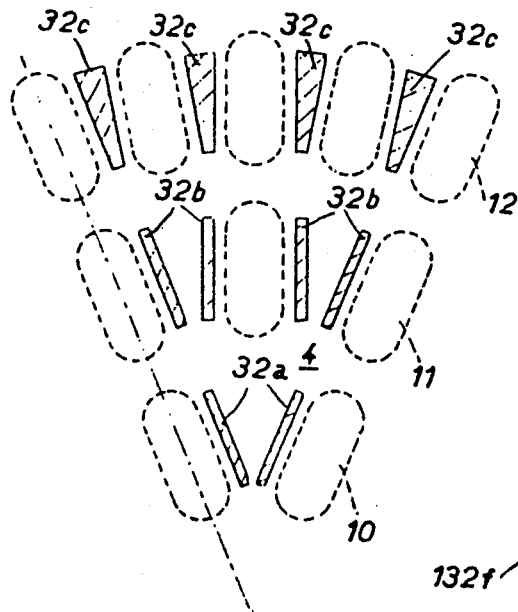
FIG. 3 is a partial view of a thyristor as per FIGS. 1 and 2 seen from the anode side.

In the arrangement in accordance with the invention shown in FIG. 3 the anode short-circuits are narrow strips 32a, 32b and 32c disposed parallel to the major axis of the respective cathode domains 10, 11 and 12. The strips 32c are in the shape of elongate isosceles trapeziums the non-parallel edges of which are parallel to the major axes of the two cathode domains between which they are located.

It will be understood that the transverse cross-section of the discharge between a cathode domain and the anode is governed by the shape in plan of the cathode domain, the current density increasing from the marginal areas to the center of the unit cell. Thus the elongate anode short-circuit strips parallel to the major axis are disposed in the marginal areas of the discharge, away from the center at which the initial discharge is created, so that their contribution to the gate current during the turn on phase is reduced, although they are sufficiently close to the center of the discharge for charge collection on turn off to be efficient. It will be noted that the increased path of charges collected by the anode short-circuits is compensated by an increase in the width of the corresponding area and that the parallel relationship of the short-circuit strips and the major axis confers upon the strips an efficiency which is substantially regular over their entire length.

In practise, the arrangement in accordance with the invention is found to reduce the gate striking current by a factor of 4 as compared with conventional arrangements, other characteristics and operating conditions being the same.

Figure 4:
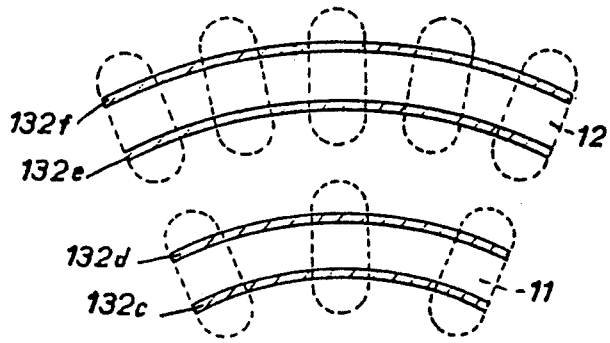
FIG. 4 is a view analogous to FIG. 3 of an alternative embodiment of the invention.
Figure 5:
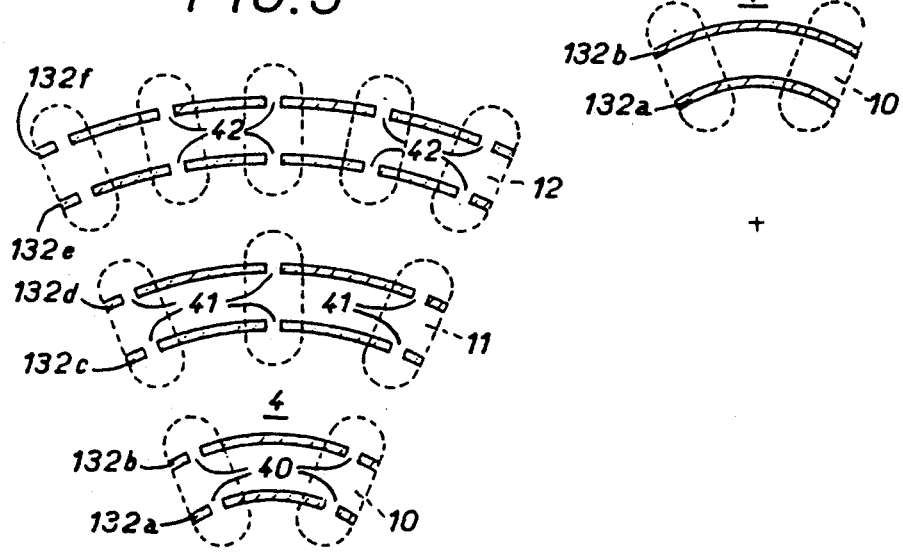
FIG. 5 shows a development of the FIG. 4 embodiment.

The arrangement shown in FIG. 4 yields virtually identical results; here the anode short-circuit strips are annuli 132a, 132b, 132c, 132d, 132e and 132f concentric with the pellet 1 (FIG. 1). These annuli pass over the marginal areas of the unit cells, towards the ends of the major axis of the cathode domains. As in the FIG. 3 arrangement the anode short-circuit annuli are away from the center of the discharge but sufficiently close to the center to be able to collect charge during the turn off phase.

It will be noted that the annuli 132a and 132b for the ring of domains 10, 132c and 132d for the ring 11 and 132e, 132f for the ring 12 are at the same distance from the center of the respective cells.

For the FIG. 3 and 4 arrangements to have the same geometrical definition, given the required technical function, it may be said that the strips which constitute the anode short-circuits are tangential to a circle concentric with the cell in question at two diametrally opposite points on one of the principal axes. A geometrical definition like this might seem somewhat arbitrary, if it were not borne in mind that the implementation of a semiconductor device always includes a graphic design stage.

In the FIG. 4 arrangement the annuli are continuous. The regions of the anode layer 4 are therefore divided into concentric rings interconnected only by the metalization. In the arrangement shown in FIG. 5 the short-circuit annuli 232a, 232b, 232c, 232d, 232e and 232f are interrupted by gaps 40 (232a, 232b), 41 (232c, 232d) and 42 (232e, 232f) centered on the major axes of the respective cells 10, 11 and 12. These gaps constitute bridges which establish communication between the various rings of the P type anode layer and are located at points on the anode short-circuit annuli where the discharge current is highest.

Of course, the invention is not limited to the examples described but encompasses all variant executions thereof within the scope of the appended claims.

I claim:

1. Gate turn off thyristor comprising a pellet of semiconductor material incorporating an N type cathode layer divided into separate oblong domains with major and minor principal axes intersecting at a center and defining respective unit cells, a P type gate layer which has a free surface between the cathode domains, a base layer comprising a lightly doped N type first sublayer forming a junction with the gate layer and a heavily doped N type second sublayer forming a junction with a P type anode layer, this latter being separated from said first sublayer by said second sublayer, and respective metal contact layers deposited on the free surfaces of the cathode domains, of the gate layer round the cathode domains and of the anode layer, the heavily doped N type second sublayer passing in a localized way through the anode layer to form anode short-circuit areas in contact with the anode metal layer, in which said anode short-circuit areas are in the form of elongate strips disposed in marginal areas of said cells and symmetrical relative to the centers of said cells, said strips corresponding to two separate adjacent cells.

2. Gate turn off thyristor comprising a pellet of semiconductor material incorporating an N type cathode layer divided into separate oblong domains with major and minor principal axes intersecting at a center and defining respective unit cells, a P type gate layer which has a free surface between the cathode domains, a base layer comprising a lightly doped N type first sublayer forming a junction with the gate layer and a heavily doped N type second sublayer forming a junction with a P type anode layer, and respective metal contact layers deposited on the free surfaces of the cathode domains, of the gate layer round the cathode domains and of the anode layer, the heavily doped N type second sublayer passing in a localized way through the anode layer to form anode short-circuit areas in contact with the anode metal layer, in which said anode short-circuit areas are in the form of elongate strips disposed in marginal areas of said cells and symmetrical relative to the centers of said cells wherein said anode short-circuit areas of each cell are strips tangential to a circle concentric with the cell at two diametrically opposite points on one principal axis.

3. Thyristor according to claim 2 wherein said strips are parallel to the cell major axis.

4. Thyristor according to claim 2 wherein said cells are arranged in successive rings with a common center and their major axes parallel and said anode short-circuit areas are in the form of two annuli per ring intersecting the major axis of each cell near its ends.

5. Thyristor according to claim 4 wherein said annuli are interrupted by gaps centered on the major axes of said cells.

* * * * *